United States Patent
Wu et al.

(10) Patent No.: US 8,405,085 B2
(45) Date of Patent: Mar. 26, 2013

(54) THIN FILM TRANSISTOR CAPABLE OF REDUCING PHOTO CURRENT LEAKAGE

(75) Inventors: Wen-Shin Wu, Pingtung County (TW); Chun-Yao Huang, Hsinchu (TW); Hsin-Hua Lin, Taipei County (TW)

(73) Assignee: Au Optronics Corporation, Hsinchu (TW)

( * ) Notice: Subject to any disclaimer, the term of this patent is extended or adjusted under 35 U.S.C. 154(b) by 188 days.

(21) Appl. No.: 12/957,406

(22) Filed: Dec. 1, 2010

(65) Prior Publication Data

US 2012/0139043 A1 Jun. 7, 2012

(51) Int. Cl.
H01L 29/04 (2006.01)
H01L 31/036 (2006.01)
H01L 31/0376 (2006.01)
H01L 31/20 (2006.01)

(52) U.S. Cl. .............. 257/59; 257/72; 257/E29.117; 257/E29.273

(58) Field of Classification Search .............. 257/59, 257/72, 347, E29.117, E29.273
See application file for complete search history.

(56) References Cited

U.S. PATENT DOCUMENTS

| | | | |
|---|---|---|---|
| 5,783,843 | A | 7/1998 | Lin |
| 6,323,525 | B1 | 11/2001 | Noguchi et al. |
| 2003/0155594 | A1 | 8/2003 | Ohnuma |
| 2007/0108449 | A1 | 5/2007 | Oue et al. |
| 2008/0105871 | A1 | 5/2008 | Yan et al. |
| 2009/0166630 | A1 | 7/2009 | Cho et al. |
| 2010/0025677 | A1 | 2/2010 | Yamazaki et al. |
| 2010/0044709 | A1 | 2/2010 | Nakayama et al. |
| 2010/0140614 | A1 | 6/2010 | Uchiyama et al. |

FOREIGN PATENT DOCUMENTS

| | | |
|---|---|---|
| CN | 101542742 | 9/2009 |
| EP | 0249204 | 12/1987 |

OTHER PUBLICATIONS

Kobayashi K et al, "Photo-Leakage Current of Poly-Si Thin Film Transistors with Offset and Lightly Doped Drain Structure," Japanese Journal of Applied Physics, Oct. 1, 1999, vol. 38, No. 10, Part 1, pp. 5757-5761.
"Search Report of Europe Counterpart Application", issued on Mar. 8, 2011, p. 1-p. 9.
"Second Office Action of China counterpart application" issued on Dec. 18, 2012, p. 1-p. 7.

*Primary Examiner* — Hoai V Pham
(74) *Attorney, Agent, or Firm* — Jianq Chyun IP Office (57) ABSTRACT

A thin film transistor includes a gate, a pair of electrodes, a first semiconductor layer disposed between the gate and the pair of electrodes, and a semiconductor stacked layer disposed between the first semiconductor layer and the pair of the electrodes. The semiconductor stacked layer includes a second semiconductor layer disposed adjacent to the pair of electrodes and at least one pair of semiconductor layers including a third semiconductor layer and a fourth semiconductor layer, the third semiconductor layer being sandwiched between the second semiconductor layer and the fourth semiconductor layer. In particular, the electric conductivity of the third semiconductor layer is substantially smaller than the electric conductivity of the second semiconductor layer and the electric conductivity of the fourth semiconductor layer.

11 Claims, 11 Drawing Sheets

THIN FILM TRANSISTOR CAPABLE OF REDUCING PHOTO CURRENT LEAKAGE

BACKGROUND OF THE INVENTION

1. Field of the Invention

The present invention relates to a semiconductor device. More particularly, the present invention relates to a thin film transistor.

2. Description of Related Art

As modern information technology advances, various types of displays have been widely used in screens for consumer electronic products such as mobile phones, notebook computers, digital cameras, and personal digital assistants (PDAs). Among these displays, liquid crystal displays (LCD) and organic electroluminescence displays (OELD) are the prevailing products in the market due to their advantages of being light-weight, compact, and low in power-consumption. The manufacturing process for both LCD and OELD includes forming semiconductor devices arranged in array on a substrate and the semiconductor devices include thin film transistors (TFTs).

Conventionally, thin film transistors include top-gate TFTs and bottom-gate TFTs. These TFTs have only one semiconductor layer severing as an active layer or a channel layer. The semiconductor layer of the TFTs easily generates photo current leakage if it is irradiated with light from a front-light, a backlight or an external light. The photo current leakage causes image sticking and deteriorating the display quality of the displays.

SUMMARY OF THE INVENTION

Accordingly, the present invention provides a thin film transistor capable of reducing photo current leakage.

The present invention is directed to a thin film transistor including a gate, a pair of electrodes, a first semiconductor layer disposed between the gate and the pair of electrodes, and a semiconductor stacked layer disposed between the first semiconductor layer and the pair of the electrodes. The semiconductor stacked layer includes a second semiconductor layer disposed adjacent to the pair of electrodes and at least one pair of semiconductor layers including a third semiconductor layer and a fourth semiconductor layer, the third semiconductor layer being sandwiched between the second semiconductor layer and the fourth semiconductor layer. In particular, the electric conductivity of the third semiconductor layer is substantially smaller than the electric conductivity of the second semiconductor layer and the electric conductivity of the fourth semiconductor layer.

The present invention is also directed to a thin film transistor including a gate, a pair of electrodes, and a semiconductor layer disposed on or below the gate. The semiconductor layer includes at least one first semiconductor region, at least one second semiconductor region disposed in at least one side of the first semiconductor region, and at least one pair of semiconductor regions including a third semiconductor region and a fourth semiconductor region, the third semiconductor region being sandwiched between the second semiconductor region and the fourth semiconductor region. In particular, the electric conductivity of the third semiconductor region is substantially smaller than the electric conductivity of the second semiconductor region and the electric conductivity of the fourth semiconductor region.

In light of the foregoing, the TFT has at least one pair of semiconductor layers including a third semiconductor layer and a fourth semiconductor layer, and the electric conductivity of the third semiconductor layer is substantially smaller than the electric conductivity of the fourth semiconductor layer, and thereby a build-in electric field is formed at the junction of the third semiconductor layer and the fourth semiconductor to function as an electric-hole barrier. The electric-hole barrier in the semiconductor stacked layer can effectively reduce photo current leakage of the TFT.

In order to make the aforementioned and other features and advantages of the present invention more comprehensible, several embodiments accompanied with Figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

First Embodiment

Figure 1:
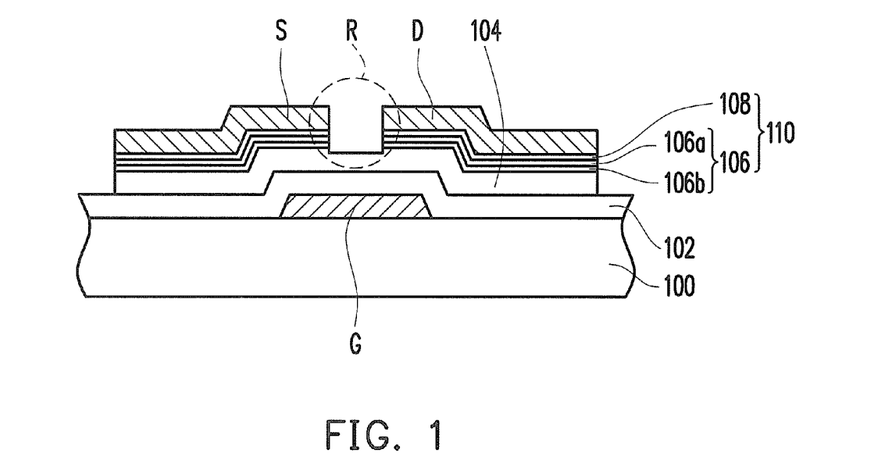
FIG. 1 is a cross-sectional view showing a TFT according to an embodiment of the present invention.
Figure 1A:
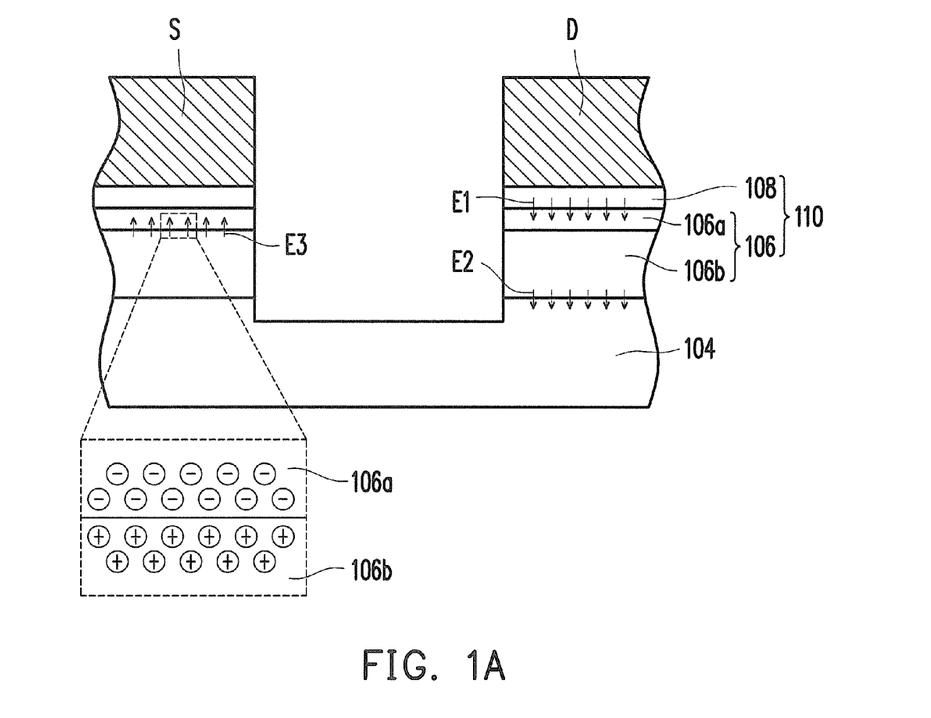
FIG. 1A is an enlarging view corresponding to the region R of FIG. 1.

FIG. 1 is a cross-sectional view showing a TFT according to an embodiment of the present invention. FIG. 1A is an enlarging view corresponding to the region R of FIG. 1. Referring to FIG. 1 and FIG. 1A, the thin film transistor of the present embodiment includes a gate G, a pair of electrodes S and D, a first semiconductor layer 104 and a semiconductor stacked layer 110.

The gate G is disposed on a substrate 100. The substrate 100 can be made of glass, quartz, organic polymer, a non-light-transmissive/reflective material (such as a conductive material, metal, wafer, ceramics, or other appropriate materials), or other appropriate materials. When the substrate 100 is made of the conductive material or metal, the substrate 100 is covered by an insulating layer (not shown) to prevent short circuit. In addition, the gate G is normally made of metallic materials in consideration of electrical conductivity. According to other embodiments of the invention, the gate G can be made of other conductive materials (such as an alloy, a metal nitride material, a metal oxide material, a metal oxynitride material, or other suitable materials), or a stacked layer containing the metallic material and any other conductive material.

In the embodiment, an insulating layer 102 is further disposed on the substrate 100 to cover the gate G. Herein, the insulating layer 102 is referred to as a gate insulating layer. The insulating layer 102 can be made of an inorganic material (such as silicon oxide, silicon nitride, or silicon oxynitride), an organic material or a stacked layer containing the insulating material and any other insulating material.

The first semiconductor layer 104 is disposed on the insulating layer 102 above the gate G. Herein, the first semiconductor layer 104 is referred to as a channel layer or an active layer. The first semiconductor layer 104 comprises a silicon-containing semiconductor material or a metal oxide semiconductor material. The silicon-containing semiconductor material may be an intrinsic semiconductor material, such as amorphous silicon, poly-silicon, microcrystalline silicon or monocrystalline silicon. The metal oxide semiconductor material can comprise indium-gallium-zinc oxide (IGZO), indium-zinc oxide (IZO), gallium-zinc oxide (GZO), zinc-tin oxide (ZTO), indium-tin oxide (ITO), or other suitable metal oxide semiconductor materials. In other embodiment, the first semiconductor layer 104 may be have lower electric conductivity.

The pair of electrodes S and D is disposed on the first semiconductor layer 104. Herein, the pair of electrodes S and D is referred to as a source and a drain. In consideration of electrical conductivity, the source S and the drain D are normally made of metallic materials. According to other embodiments of the invention, the source S and the drain D can be made of other conductive materials (such as an alloy, a metal nitride material, a metal oxide material, a metal oxynitride material, or other suitable materials), or a stacked layer containing the metallic material and any other conductive material.

The semiconductor stacked layer 110 is disposed between the first semiconductor layer 104 and the pair of the electrodes S, D. According to the embodiment, the semiconductor stacked layer 110 includes a second semiconductor layer 108 and at least one pair of semiconductor layers 106. The present invention does not limit the number of the pair of semiconductor layers 106. In this embodiment, one pair of semiconductor layers 106 is formed in the semiconductor stacked layer 110 for clearly illustration. However, in another embodiment, two or more pairs of semiconductor layers 106 can be formed in the semiconductor stacked layer 110. Herein, the semiconductor stacked layer 110 is referred to as an ohmic contact layer.

The second semiconductor layer 108 is disposed adjacent to the pair of electrodes S, D. In the embodiment, the second semiconductor layer 108 is disposed between the first semiconductor layer 104 and the pair of the electrodes S, D and contacted with the pair of the electrodes S, D. The electric conductivity of the second semiconductor layer 108 is substantially larger than the electric conductivity of the first semiconductor layer 104. The second semiconductor layer 108 comprises a doped silicon-containing semiconductor material or a metal oxide semiconductor material. The doped silicon-containing semiconductor material can be doped amorphous silicon, doped poly-silicon, doped microcrystalline silicon or doped monocrystalline silicon. The metal oxide semiconductor material is a metal-rich metal oxide semiconductor material, such as metal-rich indium-gallium-zinc oxide (IGZO), metal-rich indium-zinc oxide (IZO), metal-rich gallium-zinc oxide (GZO), metal-rich zinc-tin oxide (ZTO), metal-rich indium-tin oxide (ITO), or other suitable metal-rich metal oxide semiconductor materials, such that the electric conductivity of the second semiconductor layer 108 is substantially larger than the electric conductivity of the first semiconductor layer 104.

The at least one pair of semiconductor layers 106 includes a third semiconductor layer 106a and a fourth semiconductor layer 106b. The third semiconductor layer 106a is sandwiched between the second semiconductor layer 108 and the fourth semiconductor layer 106b, and the fourth semiconductor layer 106b is sandwiched between the third semiconductor layer 106a and the first semiconductor layer 104. In particular, the electric conductivity of the third semiconductor layer 106a is substantially smaller than the electric conductivity of the second semiconductor layer 108 and the electric conductivity of the fourth semiconductor layer 106b. In addition, the electric conductivity of the third semiconductor layer 106a is substantially greater than or equal to the electric conductivity of the first semiconductor layer 104. According to the embodiment, the material of the third semiconductor layer 106a is similar or the same to the material of the first semiconductor layer 104. For example, the third semiconductor layer 106a comprises a silicon-containing semiconductor material or a metal oxide semiconductor material. The silicon-containing semiconductor material may be an intrinsic semiconductor material, such as non-doped amorphous silicon, non-doped poly-silicon, non-doped microcrystalline silicon or non-doped monocrystalline silicon. The metal oxide semiconductor material can comprise indium-gallium-zinc oxide (IGZO), indium-zinc oxide (IZO), gallium-zinc oxide (GZO), zinc-tin oxide (ZTO), indium-tin oxide (ITO), or other suitable metal oxide semiconductor materials, preferably, the metal oxide semiconductor material is a oxygen-rich metal oxide semiconductor material, such as oxygen-rich indium-gallium-zinc oxide (IGZO), oxygen-rich indium-zinc oxide (IZO), gallium-zinc oxide (GZO), oxygen-rich zinc-tin oxide (ZTO), oxygen-rich indium-tin oxide (ITO), or other suitable oxygen-rich metal oxide semiconductor materials.

Moreover, the material of the fourth semiconductor layer 106b is similar or the same to the second semiconductor layer 108. For example, the fourth semiconductor layer 106b comprises a doped silicon-containing semiconductor material or a metal oxide semiconductor material. The doped silicon-containing semiconductor material can be doped amorphous silicon, doped poly-silicon, doped microcrystalline silicon or doped monocrystalline silicon. The metal oxide semiconductor material is a metal-rich metal oxide semiconductor material, such as metal-rich indium-gallium-zinc oxide (IGZO), metal-rich indium-zinc oxide (IZO), metal-rich gallium-zinc oxide (GZO), metal-rich zinc-tin oxide (ZTO), metal-rich indium-tin oxide (ITO), or other suitable metal-rich metal oxide semiconductor materials.

In the embodiment of FIG. 1, the TFT has the semiconductor stacked layer 110 including the second, the third and the fourth semiconductor layers 108, 106a, 106b between the first semiconductor layer 104 and the pair of the electrodes S, D, wherein the electric conductivity of the third semiconductor layer 106a is substantially smaller than the electric conductivity of the second semiconductor layer 108 and the electric conductivity of the fourth semiconductor layer 106b. When no voltage bias is applied to the TFT, a build-in electric field E3 is formed at the junction of the third semiconductor layer 106a and the fourth semiconductor 106b to function as an hole barrier, as shown in FIG. 1A. For details, because the electric conductivity of the third semiconductor layer 106a (such as non-doped silicon-containing semiconductor material as an example) is substantially smaller than the electric conductivity of the fourth semiconductor layer 106b (such as doped silicon-containing semiconductor material as an example), the carriers (such as free electrons) in the fourth semiconductor layer 106b may diffuse toward the third semiconductor layer 106a, such that space-charge region is distributed in the fourth semiconductor layer 106b near the junction. In other words, the build-in electric field E3 is formed because of the ionized carriers at the junction of the third semiconductor layer 106a and the fourth semiconductor 106b. In particular, the build-in electric field E3 is reverse to the electric field E1 formed between the second semiconductor layer 108 and the third semiconductor layer 106a, and the build-in electric field E3 is also reverse to the electric field E2 formed between the fourth semiconductor layer 106b and the first semiconductor layer 104. If the TFT generates photo current, the build-in electric field E3 (functions as the electric-hole barrier) can effectively inhibit the photo hole current from semiconductor layer 104 to source S, so as to reduce photo current leakage of the TFT.

Figure 2:
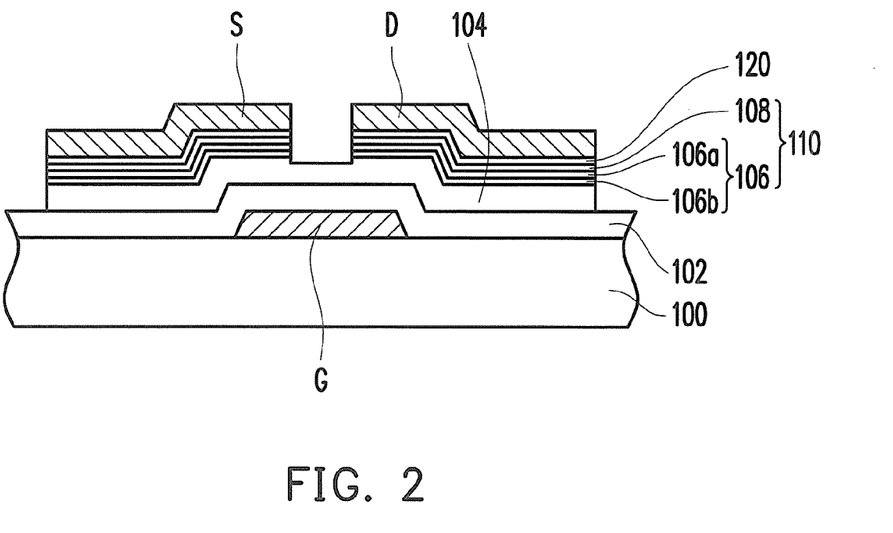
FIGS. 2~7 are cross-sectional views showing a TFT according to several embodiments of the present invention.

FIG. 2 is cross-sectional view showing a TFT according to an embodiment of the present invention. The embodiment shown in FIG. 2 is similar to the embodiment shown in FIG. 1, and thus components identical to those in FIG. 1 are represented by the same numerals in FIG. 2 and are not repeated herein. The difference between the embodiment shown in FIG. 2 and the embodiment shown in FIG. 1 lies in that the TFT further comprises an additional semiconductor layer 120 disposed between the second semiconductor layer 108 of the semiconductor stacked layer 110 and the pair of electrodes S, D. The additional semiconductor layer 120 may have a material the same or similar to material of the first semiconductor layer 104 or the third semiconductor layer 106a. Therefore, the additional semiconductor layer 120 comprises a silicon-containing semiconductor material or a metal oxide semiconductor material. The silicon-containing semiconductor material may be an intrinsic semiconductor material, such as amorphous silicon, poly-silicon, microcrystalline silicon or monocrystalline silicon. The metal oxide semiconductor material can comprise indium-gallium-zinc oxide (IGZO), indium-zinc oxide (IZO), gallium-zinc oxide (GZO), zinc-tin oxide (ZTO), indium-tin oxide (ITO), or other suitable metal oxide semiconductor materials.

Figure 3:
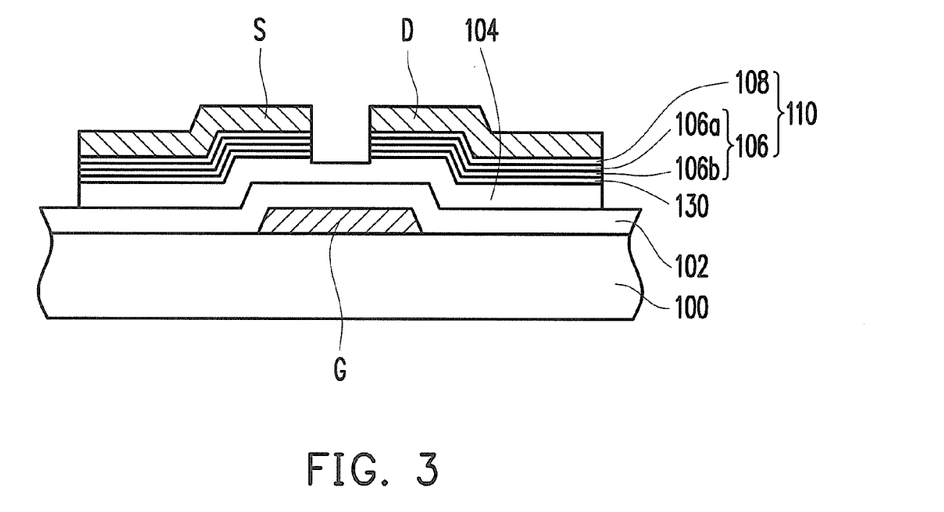

FIG. 3 is cross-sectional view showing a TFT according to an embodiment of the present invention. The embodiment shown in FIG. 3 is similar to the embodiment shown in FIG. 1, and thus components identical to those in FIG. 1 are represented by the same numerals in FIG. 3 and are not repeated herein. The difference between the embodiment shown in FIG. 3 and the embodiment shown in FIG. 1 lies in that the TFT further comprises a buffer layer 130 disposed between the first semiconductor layer 104 and the fourth semiconductor layer 106b of the semiconductor stacked layer 110. In particular, the electric conductivity of the buffer layer 130 is gradually increased from the first semiconductor layer 104 toward the fourth semiconductor layer 106b of the semiconductor stacked layer 110. For details, the electric conductivity of the buffer layer 130 near the first semiconductor layer 104 is substantially smaller than the electric conductivity of the buffer layer 130 near the fourth semiconductor layer 106b of the semiconductor stacked layer 110, and the electric conductivity of the buffer layer 130 is gradually increased from the first semiconductor layer 104 toward the fourth semiconductor layer 106b of the semiconductor stacked layer 110. The buffer layer 130 can be made of a doped silicon-containing semiconductor material with gradient dopant concentration or a metal oxide semiconductor material with gradient oxygen or metal concentration. The doped silicon-containing semiconductor material can be doped amorphous silicon, doped poly-silicon, doped microcrystalline silicon or doped monocrystalline silicon. The metal oxide semiconductor material can be indium-gallium-zinc oxide (IGZO), indium-zinc oxide (IZO), gallium-zinc oxide (GZO), metal-rich zinc-tin oxide (ZTO), m indium-tin oxide (ITO), or other suitable metal oxide semiconductor materials. In another embodiment, the additional semiconductor layer 120 of the FIG. 2 can also be applied in the structure of the FIG. 3.

Figure 4:
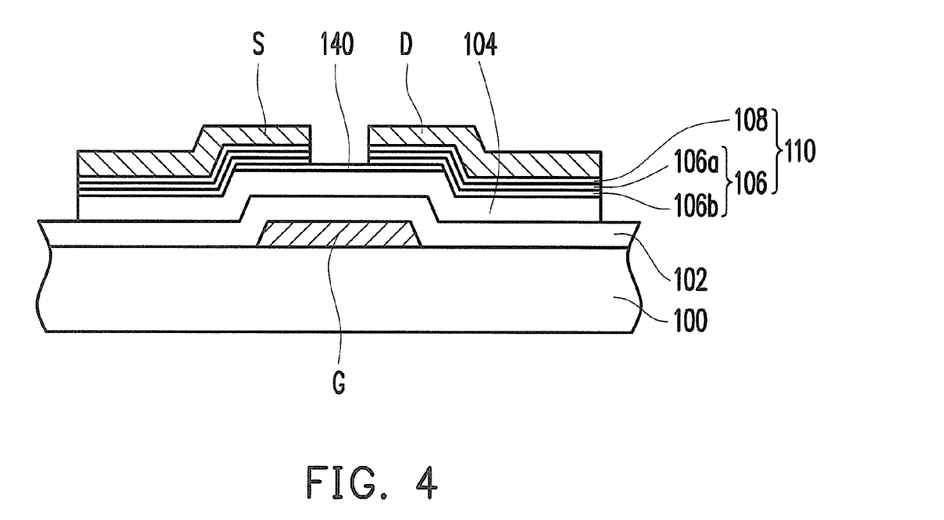

FIG. 4 is cross-sectional view showing a TFT according to an embodiment of the present invention. The embodiment shown in FIG. 4 is similar to the embodiment shown in FIG. 1, and thus components identical to those in FIG. 1 are represented by the same numerals in FIG. 4 and are not repeated herein. The difference between the embodiment shown in FIG. 4 and the embodiment shown in FIG. 1 lies in that the TFT further comprises a dielectric island 140 disposed on the first semiconductor layer 104 and between the first semiconductor layer 104 and the semiconductor stacked layer 110. The dielectric island 140 is also referred to as an etching stop island and can protect the first semiconductor layer 104. The dielectric island 140 may comprise silicon nitride, silicon oxynitride, silicon oxide or other suitable dielectric materials. In other embodiments, at least one of the additional semiconductor layer 120 in FIG. 2 and the buffer layer 130 in FIG. 3 can also be applied in the structure of FIG. 4.

Figure 5:
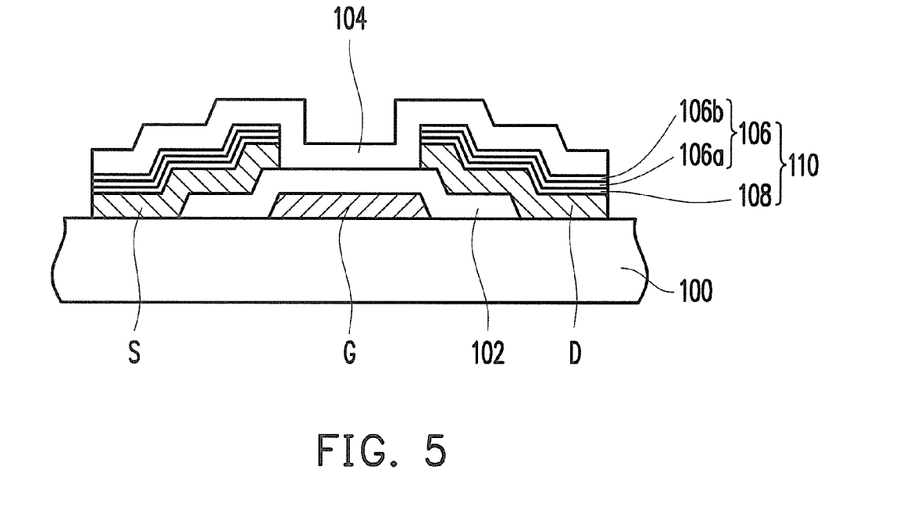

FIG. 5 is cross-sectional view showing a TFT according to an embodiment of the present invention. The embodiment shown in FIG. 5 is similar to the embodiment shown in FIG. 1, and thus components identical to those in FIG. 1 are represented by the same numerals in FIG. 5 and are not repeated herein. The difference between the embodiment shown in FIG. 5 and the embodiment shown in FIG. 1 lies in that the pair of electrodes S, D is disposed on the insulating layer 102, and the first semiconductor layer 104 is disposed on the pair of electrodes S, D and the insulating layer 102. In addition, the second semiconductor layer 108 of the semiconductor stacked layer 110 is disposed on the pair of electrodes S, D, the third semiconductor layer 106a is disposed on the second semiconductor layer 108, and the fourth semiconductor layer 106b is disposed on the third semiconductor layer 106a. In other embodiments, at least one of the additional semiconductor layer 120 in FIG. 2 and the buffer layer 130 in FIG. 3 can also be applied in the structure of FIG. 5.

In the TFTs shown in FIGS. 1-5, the gate G is disposed below the first semiconductor layer 104, and thus these TFTs are so-called bottom gate TFTs. However, the present invention does not limit herein. According to another embodiment, the semiconductor stacked layer can also be applied to top gate TFTs, as shown in FIGS. 6-7.

Figure 6:
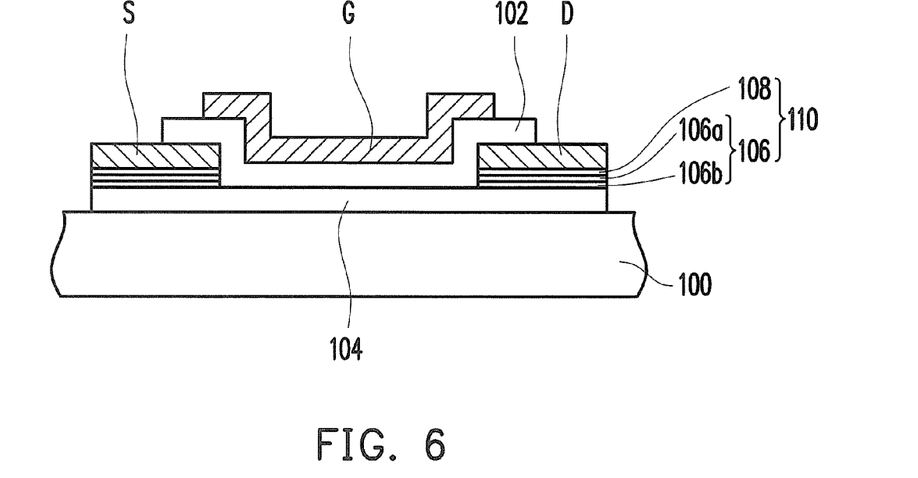

FIG. 6 is cross-sectional view showing a TFT according to an embodiment of the present invention. The embodiment shown in FIG. 6 is similar to the embodiment shown in FIG. 1, and thus components identical to those in FIG. 1 are represented by the same numerals in FIG. 6 and are not repeated herein. The difference between the embodiment shown in FIG. 6 and the embodiment shown in FIG. 1 lies in that the pair of electrodes S, D is disposed below the gate G, and the first semiconductor layer 104 is disposed below the pair of electrodes S, D and the gate G. Therefore, in the TFT of FIG. 6, the first semiconductor layer 104 is disposed on the substrate 100, the semiconductor stacked layer 110 is disposed on the first semiconductor layer 104, the pair of electrodes S, D is disposed on the semiconductor stacked layer 110, the insulating layer 102 is disposed on the pair of electrodes S, D, and the gate G is disposed on the insulating layer 102. In other embodiments, at least one of the additional semiconductor layer 120 in FIG. 2 and the buffer layer 130 in FIG. 3 can also be applied in the structure of FIG. 6.

Figure 7:
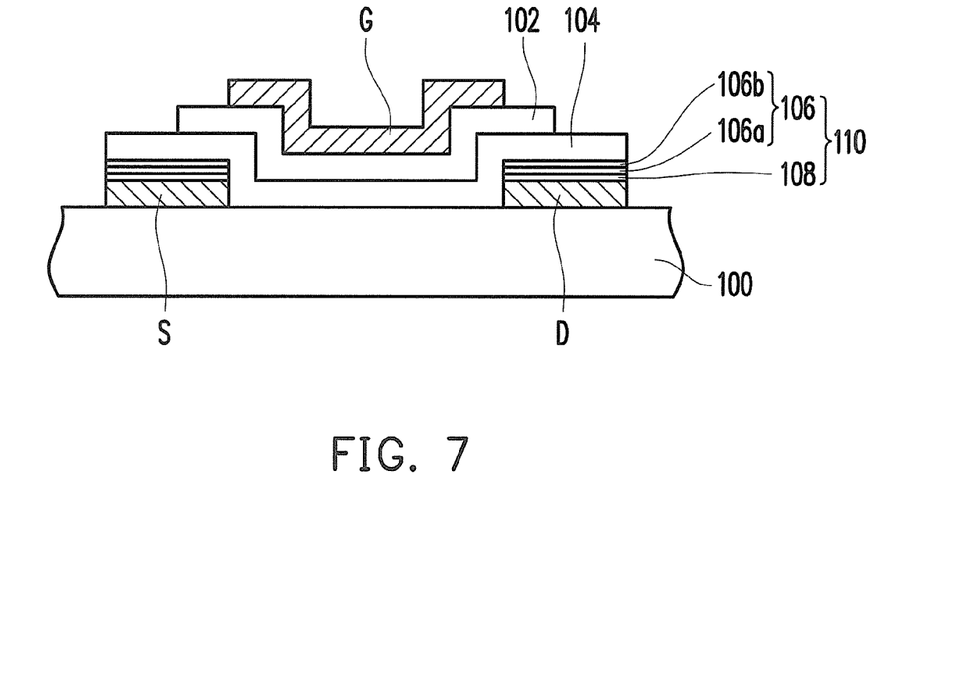

FIG. 7 is cross-sectional view showing a TFT according to an embodiment of the present invention. The embodiment shown in FIG. 7 is similar to the embodiment shown in FIG. 1, and thus components identical to those in FIG. 1 are represented by the same numerals in FIG. 7 and are not repeated herein. The difference between the embodiment shown in FIG. 7 and the embodiment shown in FIG. 1 lies in that the pair of electrodes S, D is disposed below the gate G, and the first semiconductor layer 104 is disposed between the pair of electrodes S, D and the gate G. Therefore, in the TFT of FIG. 7, the pair of electrodes S, D is disposed on the substrate 100, the semiconductor stacked layer 110 is disposed on the pair of electrodes S, D, the first semiconductor layer 104 is disposed on the semiconductor stacked layer 110, the insulating layer 102 is disposed on the first semiconductor layer 104, and the gate G is disposed on the insulating layer 102. In other embodiments, at least one of the additional semiconductor layer 120 in FIG. 2 and the buffer layer 130 in FIG. 3 can also be applied in the structure of FIG. 7.

In the TFTs of the forgoing amendments, in consideration of the electrically connecting between the pair of electrodes S, D and the first semiconductor layer 104, it is preferable to design that the pair of electrodes S, D is contacted with the second semiconductor layer 108 of the semiconductor stacked layer. However, it does not limit the present invention.

Second Embodiment

Figure 8:
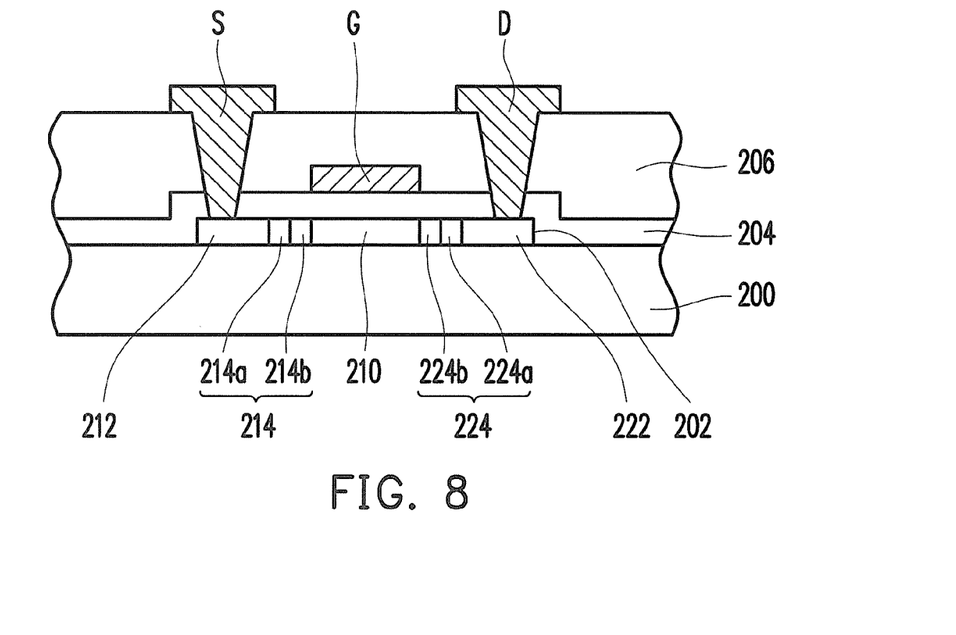
FIGS. 8~11 are cross-sectional views showing a TFT according to embodiments of the present invention.

FIG. 8 is cross-sectional views showing a TFT according to embodiments of the present invention. Referring to FIG. 8, the thin film transistor of the present embodiment includes a gate G, a pair of electrodes S, D and a semiconductor layer 202.

The semiconductor layer 202 is disposed on a substrate 200. The substrate 200 can be made of glass, quartz, organic polymer, a non-light-transmissive/reflective material (such as a conductive material, metal, wafer, ceramics, or other appropriate materials), or other appropriate materials. When the substrate 200 is made of the conductive material or metal, the substrate 200 is covered by an insulating layer (not shown) to prevent short circuit. The semiconductor layer 202 comprises silicon-containing semiconductor material, such as poly-silicon, microcrystalline silicon, monocrystalline silicon, or amorphous silicon. In addition, the semiconductor layer 202 includes at least one first semiconductor region 210, at least one second semiconductor region 212, 222 and at least one pair of semiconductor regions 214, 224. Herein, the first semiconductor region 210 is referred to as a channel region or an active region.

In the embodiment, there are two second semiconductor regions 212, 222 disposed at two sides of the first semiconductor region 210 and two pairs of semiconductor regions 214, 224 between the first semiconductor region 210 and the second semiconductor region 212 and between the first semiconductor region 210 and the second semiconductor region 214 for illustration. However, the present invention does not limit the numbers of the first semiconductor region, the second semiconductor region, and the pair of semiconductor regions. Herein, both of the second semiconductor region 212 and the pairs of semiconductor regions 214 are referred to as ohmic contact regions, and both of the second semiconductor region 222 and the pairs of semiconductor regions 224 are also referred to as ohmic contact regions.

The pair of semiconductor regions 214 includes a third semiconductor region 214a and a fourth semiconductor region 214b, and the third semiconductor region 214a is sandwiched between the second semiconductor region 212 and the fourth semiconductor region 214b. The pair of semiconductor regions 224 including a third semiconductor region 224a and a fourth semiconductor region 224b, and the third semiconductor region 224a is sandwiched between the second semiconductor region 222 and the fourth semiconductor region 224b.

According to the embodiment, the electric conductivity of the first semiconductor region 210 is substantially smaller than the electric conductivity of the second semiconductor regions 212, 222 and the electric conductivity of the pairs of semiconductor regions 214, 224. For example, the first semiconductor region 210 is an intrinsic semiconductor region or a non-doped semiconductor region, while the second semiconductor regions 212, 222 and the pairs of semiconductor regions 214, 224 are doped semiconductor regions (such as n-type or p-type doped semiconductor regions). More specific, the electric conductivity (such as dopant concentration as an example) of the third semiconductor region 214a is substantially smaller than the electric conductivity (such as dopant concentration as an example) of the second semiconductor region 212 and the electric conductivity (such as dopant concentration as an example) of the fourth semiconductor region 214b, and the electric conductivity of the third semiconductor region 224a is substantially smaller than the electric conductivity of the second semiconductor region 222 and the electric conductivity of the fourth semiconductor region 224b. In addition, the electric conductivity of the third semiconductor regions 214a, 224a is substantially greater than or equal to the electric conductivity of the first semiconductor region 210.

The semiconductor layer 202 is covered by an insulating layer 204. Herein, the insulating layer 204 is referred to as a gate insulating layer. The insulating layer 204 can be made of an inorganic material (such as silicon oxide, silicon nitride, or silicon oxynitride), an organic material or a stacked layer containing the insulating material and any other insulating material.

The gate G is disposed on the insulating layer 204. In consideration of electrical conductivity, the gate G is normally made of metallic materials. According to other embodiments of the invention, the gate G can be made of other conductive materials (such as an alloy, a metal nitride material, a metal oxide material, a metal oxynitride material, or other suitable materials), or a stacked layer containing the metallic material and any other conductive material.

The gate G is further covered by a protective layer 206. The protective layer 206 can be made of an organic material (such as polyester, polyethylene, cycloolefin, polyimide, polyamide, polyalcohols, polyphenylene, polyether, polyketone, other suitable materials, or a combination thereof), an inorganic material (such as silicon oxide, silicon nitride, or silicon oxynitride), or a stacked layer containing the insulating material and any other insulating material.

The pair of electrodes S, D is disposed on and in the protective layer 206, and pair of electrodes S, D is contacted with the second semiconductor regions 212, 222. Herein, the pair of electrodes S and D is referred to as a source and a drain. In consideration of electrical conductivity, the source S and the drain D are normally made of metallic materials. According to other embodiments of the invention, the source S and the drain D can be made of other conductive materials (such as an alloy, a metal nitride material, a metal oxide material, a metal oxynitride material, or other suitable materials), or a stacked layer containing the metallic material and any other conductive material.

In the TFT of FIG. 8, the semiconductor layer 202 includes at least one first semiconductor region 210, at least one second semiconductor region 212/222 and at least one pair of semiconductor regions 214/224, and the pair of semiconductor region 214/224 includes a third semiconductor region 214a/224a and a fourth semiconductor region 214b/224b. The electric conductivity of the third semiconductor region 214a/224a is substantially smaller than the electric conductivity of the second semiconductor region 212/222 and the electric conductivity of the fourth semiconductor region 214b/224b. When no voltage bias is applied to the TFT, a build-in electric field is formed at the junction of the third semiconductor region 214a/224a and the fourth semiconductor region 214b/224b to function as an electric-hole barrier. Similar to the first embodiment of FIG. 1A, because the electric conductivity of the third semiconductor region 214a/224a (such as an intrinsic semiconductor region as example) is substantially smaller than the electric conductivity of the fourth semiconductor region 214b/224b (such as a doped semiconductor region as example), the carriers (such as free electrons) in the fourth semiconductor region 214b/224b may diffuse toward the third semiconductor region 214a/224a, such that space-charge region is distributed in the fourth semiconductor region 214b/224b near the junction. Therefore, the build-in electric field is formed by the ionized carriers at the junction of the third semiconductor region 214a/224a and the fourth semiconductor region 214b/224b. In particular, said build-in electric field is reverse to the electric field formed between the second semiconductor region 212/222 and the third semiconductor region 214a/224a and the electric field formed between the fourth semiconductor region 214b/224b and the first semiconductor region 210. If the TFT generates photo current, said build-in electric field (functions as the electric-hole barrier) can effectively inhibit the photo hole current from semiconductor region 210 to source S, so as to reduce photo current leakage of the TFT.

Figure 9:
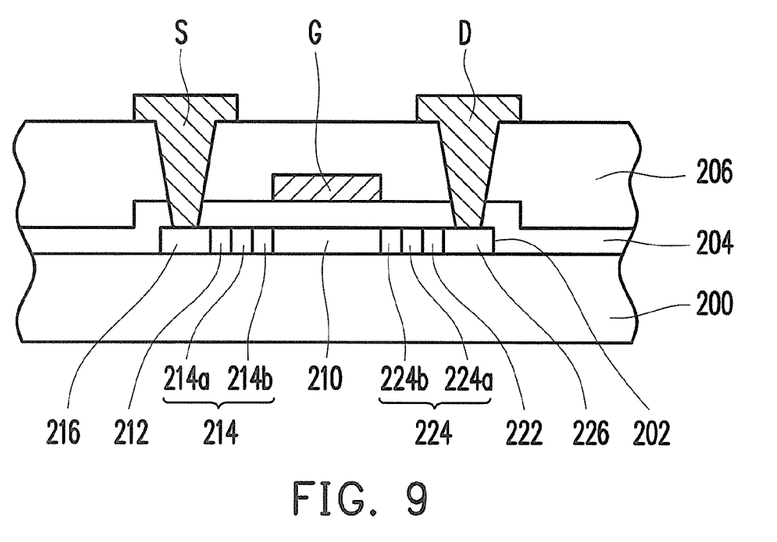

FIG. 9 is cross-sectional view showing a TFT according to an embodiment of the present invention. The embodiment shown in FIG. 9 is similar to the embodiment shown in FIG. 8, and thus components identical to those in FIG. 8 are represented by the same numerals in FIG. 9 and are not repeated herein. The difference between the embodiment shown in FIG. 9 and the embodiment shown in FIG. 8 lies in that the semiconductor layer 202 of the TFT further comprises at least one additional semiconductor region 216/226. In the embodiment, there are two additional semiconductor regions 216, 226 in the semiconductor layer 202. The additional semiconductor region 216 is disposed between the second semiconductor region 212 and the source S, and the additional semiconductor region 226 is disposed between the second semiconductor region 222 and the drain D. The electric conductivity of the additional semiconductor regions 216, 226 is substantially greater than or equal to the electric conductivity of the first semiconductor region 210.

Figure 10:
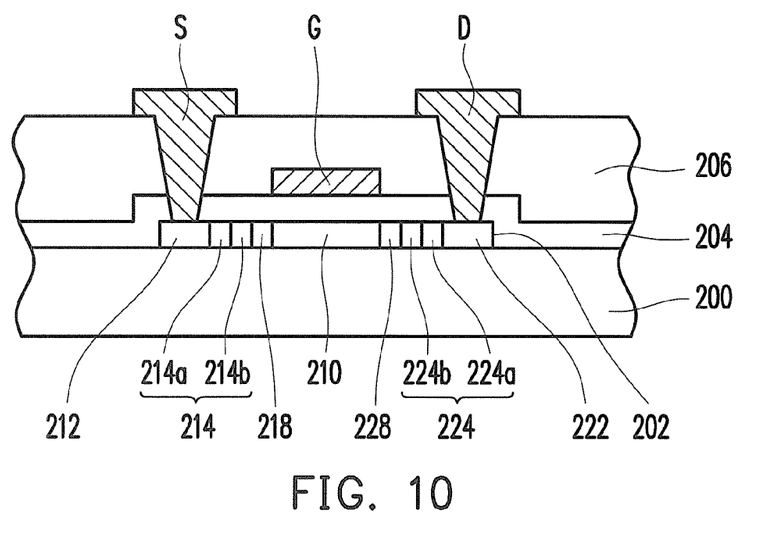

FIG. 10 is cross-sectional view showing a TFT according to an embodiment of the present invention. The embodiment shown in FIG. 10 is similar to the embodiment shown in FIG. 8, and thus components identical to those in FIG. 8 are represented by the same numerals in FIG. 10 and are not repeated herein. The difference between the embodiment shown in FIG. 10 and the embodiment shown in FIG. 8 lies in that n the semiconductor layer 202 of the TFT further comprises at least one buffer region 218/228. In the embodiment, there are two buffer regions 218, 228 in the semiconductor layer 202. The buffer region 218 is disposed between the first semiconductor region 210 and the fourth semiconductor region 214b, and the buffer region 228 is disposed between the first semiconductor region 210 and the fourth semiconductor region 224b. The electric conductivity of the buffer region 218 is gradually increased from the first semiconductor region 210 toward the fourth semiconductor region 214b, and the electric conductivity of the buffer region 228 is gradually increased from the first semiconductor region 210 toward the fourth semiconductor region 224b. For details, the electric conductivity of the buffer region 218/228 near the first semiconductor region 210 is smaller than the electric conductivity of the buffer region 218/228 near the fourth semiconductor region 214b/224b, and the electric conductivity of the buffer region 218/228 is gradually increased from the first semiconductor region 210 toward the fourth semiconductor region 214b/224b. In the embodiment, the buffer regions 218, 228 are respectively a doped semiconductor region with gradient dopant concentration.

Figure 11:
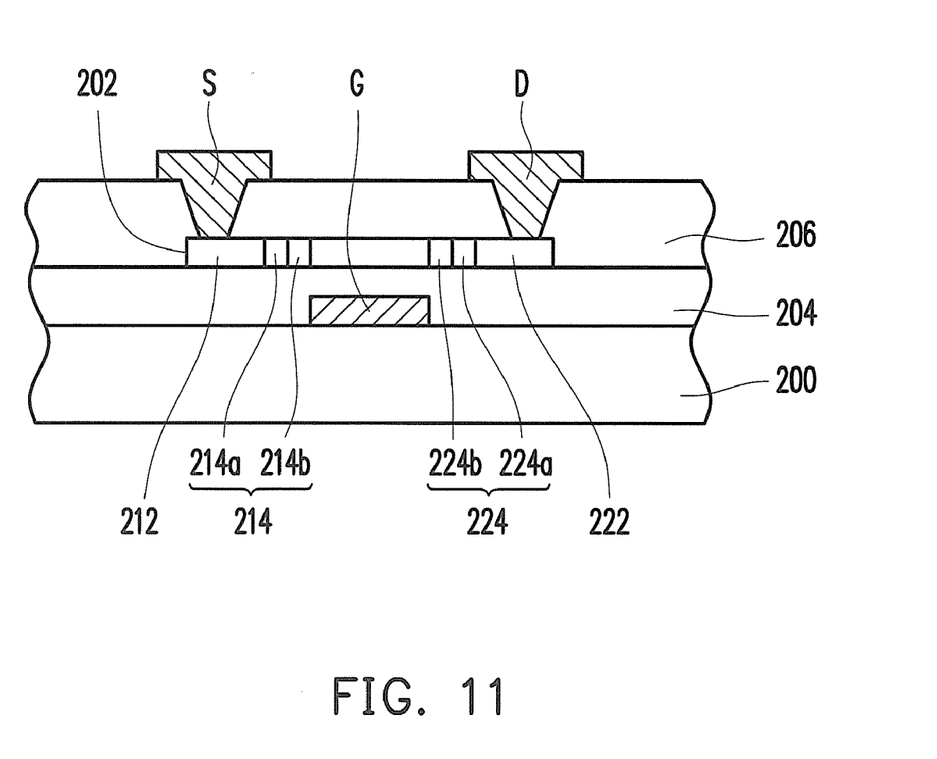

FIG. 11 is cross-sectional view showing a TFT according to an embodiment of the present invention. The embodiment shown in FIG. 11 is similar to the embodiment shown in FIG. 8, and thus components identical to those in FIG. 8 are represented by the same numerals in FIG. 11 and are not repeated herein. The difference between the embodiment shown in FIG. 11 and the embodiment shown in FIG. 8 lies in that the semiconductor layer 202 of the TFT is disposed above the gate G. Therefore, in the TFT of FIG. 11, the gate G is disposed on the substrate 200, the insulating layer 204 covers the gate G, the semiconductor layer 202 is disposed on the insulating layer 204, the protective layer 206 covers the semiconductor layer 202 and the pair of electrodes S, D is disposed on the protective layer 206. In other embodiments, the at least one of the additional semiconductor region 216/226 in FIG. 9 and the buffer region 218/228 in FIG. 10 can also be applied in the semiconductor layer 202 of FIG. 11.

EXAMPLE AND COMPARATIVE EXAMPLES

In the following description, Example 1 and Comparative Examples 1-2 illustrate that photo current leakage of the TFT having the semiconductor sacked layer of the present invention is certainly reduced. The TFT of Example 1 has a structure as shown in FIG. 1, in which the second semiconductor layer 108 of the semiconductor stacked layer 110 comprises n-doped amorphous silicon as an example and has a thickness about 200 angstrom as an example, the third semiconductor layer 106a of the semiconductor stacked layer 110 comprises non-doped amorphous silicon as an example and has a thickness about 100 angstrom as an example, and the fourth semiconductor layer 106b of the semiconductor stacked layer 110 comprises n-doped amorphous silicon as an example and has a thickness about 300 angstrom as an example. Herein, the semiconductor stacked layer 110 comprising the second semiconductor layer 108 and at least one pair of semiconductor layers 106 including a third semiconductor layer 106a and a fourth semiconductor layer 106b is referred to as an ohmic contact layer. The TFT of Comparative Example 1 is a conventional TFT having only one ohmic contact layer of about 200 angstrom. The TFT of Comparative Example 2 is a conventional TFT having only one ohmic contact layer of about 600 angstrom.

FIGS. 12~15 are IV-curve diagrams showing pixel holding capability (photo current leakage). In FIGS. 12~15, the TFTs of Example 1 and Comparative Examples 1-2 are used as a switch of a pixel of a liquid crystal display (LCD), and X axis represents the gate-source voltage (Vgs) and Y axis represents drain-source current (Ids).

Figure 12:
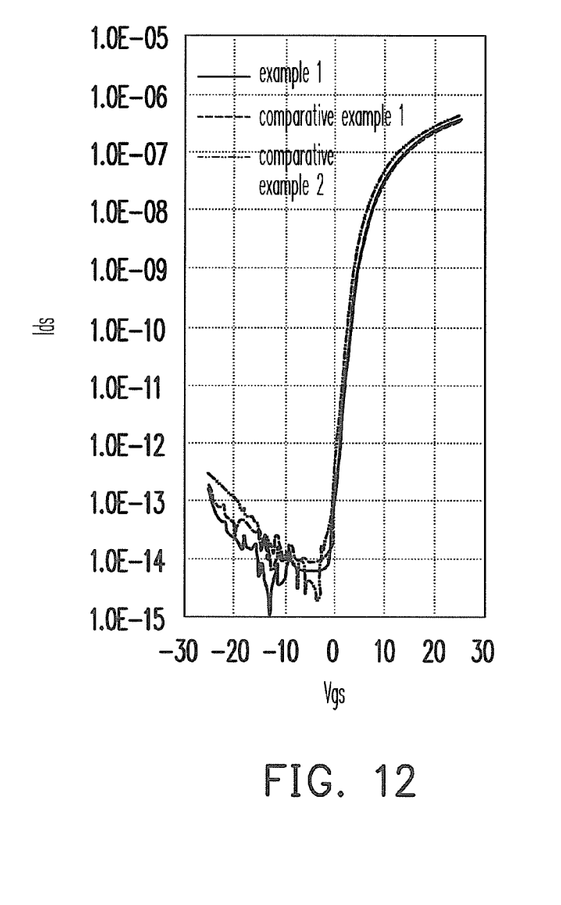
FIGS. 12~15 are IV-curve diagrams showing pixel holding capability.
Figure 13:
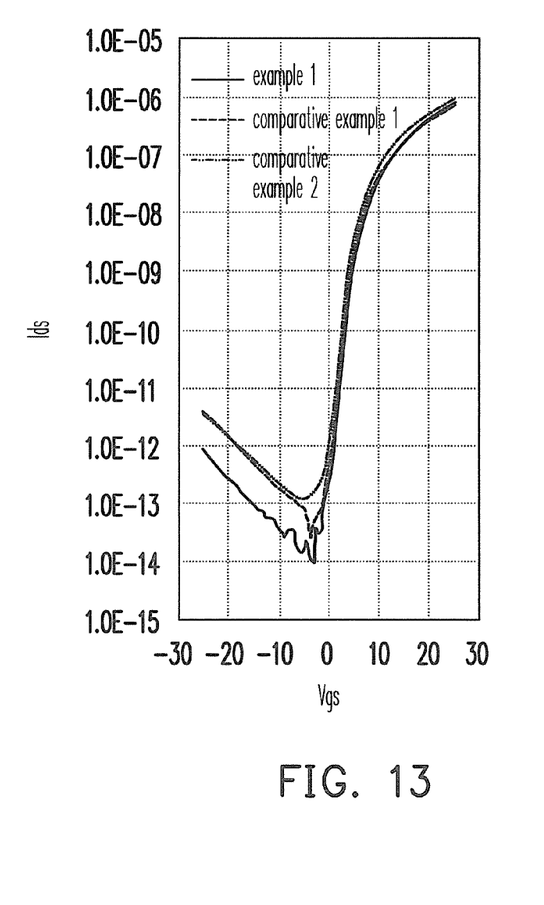

Referring to FIGS. 12-13, the LCDs with the TFTs of Example 1 and Comparative Examples 1-2 are placed in a dark environment. The I-V curves (Ids-Vgs curves) in FIG. 12 are obtained if the drain-source voltage (Vds) applied to the TFTs is about 5V. The I-V curves in FIG. 13 are obtained if the drain-source voltage (Vds) applied to the TFTs is about 15V. As shown in FIGS. 12-13, the TFT of Example 1 has lower photo current leakage (Ids) compared with the TFTs of Comparative Examples 1-2, especially, if the drain-source voltage (Vds) is higher (FIG. 13), the leakage current (Ids) reducing effect is more obvious.

Figure 14:
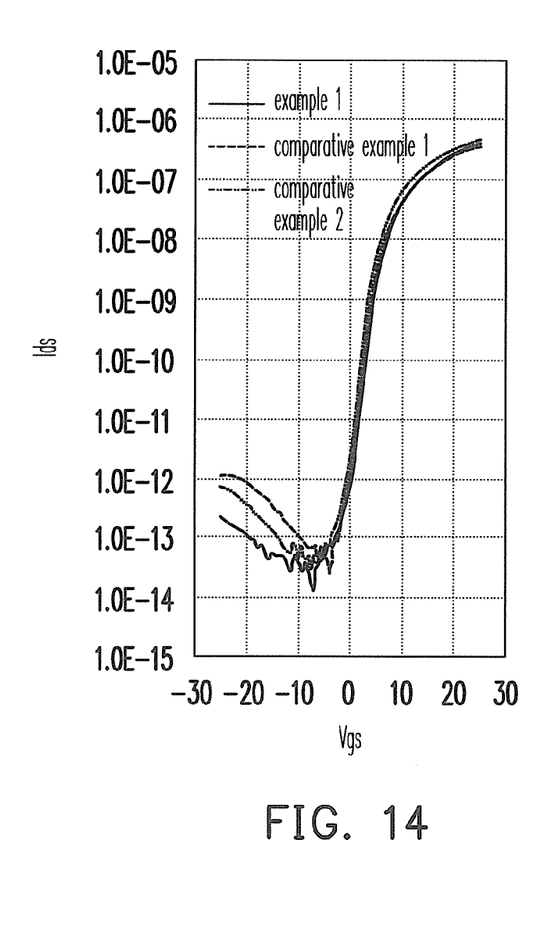
Figure 15:
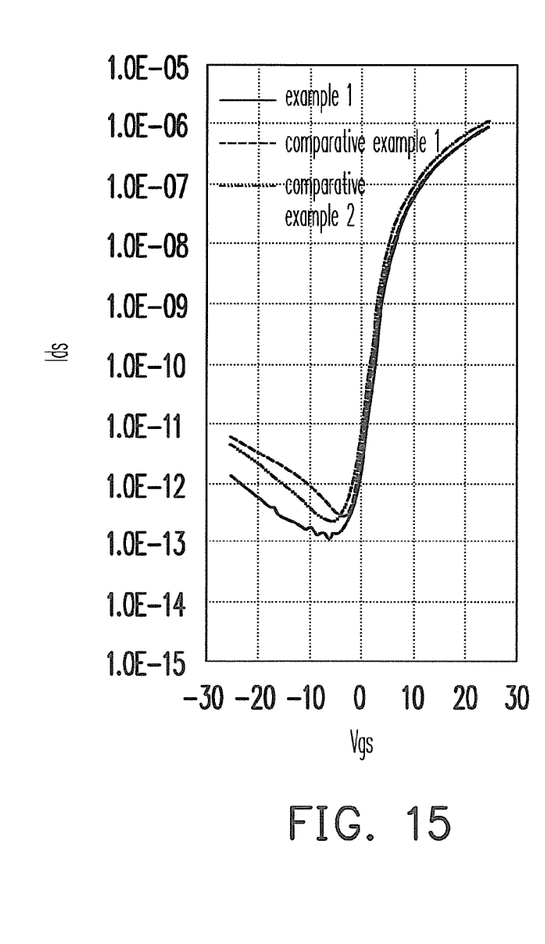

Referring to FIGS. 14-15, the LCDs with the TFTs of Example 1 and Comparative Examples 1-2 are not in a dark environment, and the backlight modules of the LCDs provide illumination of about 500 nits. Similarly, the I-V curves in FIG. 14 are obtained if the drain-source voltage (Vds) applied to the TFTs is about 5V. The I-V curves (Ids-Vgs curves) in FIG. 15 are obtained if the drain-source voltage (Vds) applied to the TFTs is about 15V. As shown in FIGS. 14-15, the TFT of Example 1 has lower photo leakage current (Ids) compared with the TFTs of Comparative Examples 1-2. Especially, in FIG. 14, the photo current leakage (Ids) of the example 1 is down about 79.9% (at Vgs=−15V) compared with Comparative Example 1. In FIG. 15, the photo current leakage of the example 1 is down about 88.9% (at Vgs=−15V) compared with Comparative Example 1.

Figure 16:
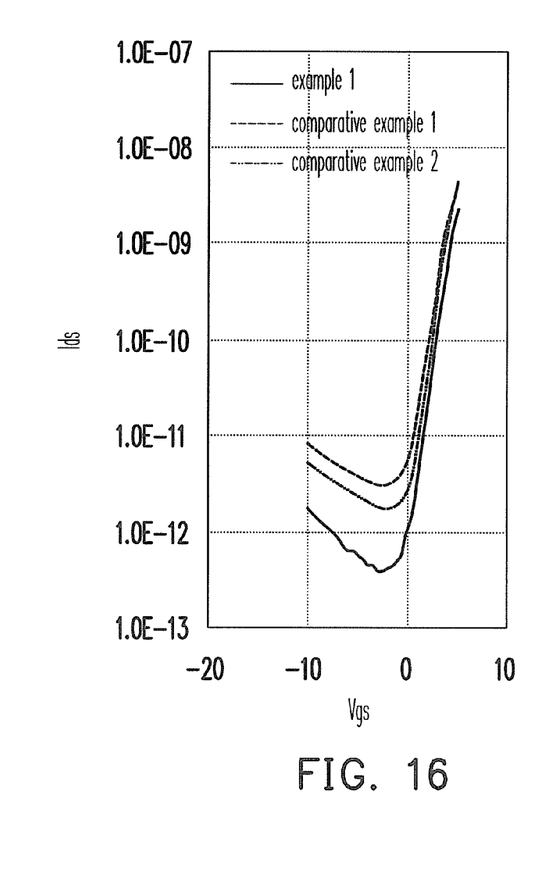
FIGS. 16~17 are IV-curve diagrams showing the TFT leakage current under the operation of the TFT in a driver.
Figure 17:
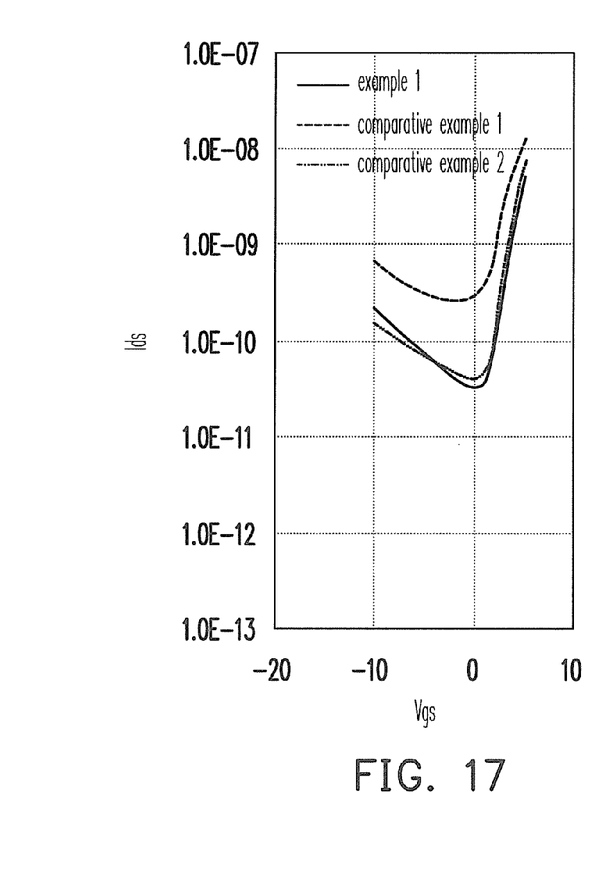

FIGS. 16~17 are IV-curve diagrams showing the TFT leakage current under the operation of the TFT in driver such as gate driver on array (GOA). In FIGS. 16~17, the TFTs of Example 1 and Comparative Examples 1-2 are used as a switch of a GOA, and X axis represents the gate-source voltage (Vgs) and Y axis represents drain-source current (Ids). Herein, the GOA having the TFTs of Example 1 and Comparative Examples 1-2 are in a dark environment. The I-V curves (Ids-Vgs curves) in FIG. 16 are obtained if the drain-source voltage (Vds) applied to the TFTs is about 30V. The I-V curves in FIG. 17 are obtained if the drain-source voltage (Vds) applied to the TFTs is about 50V. As FIGS. 16-17 shown, the TFT of Example 1 has lower photo current leakage (Ids) compared with the TFTs of Comparative Examples 1-2. Especially, in FIG. 16, the photo current leakage of Example 1 is down about 81.8% (at Vgs=0V) compared with the comparative example 1. In FIG. 17, the photo current leakage of Example 1 is down about 87.2% (at Vgs=0V) compared with the comparative example 1.

Figure 18:
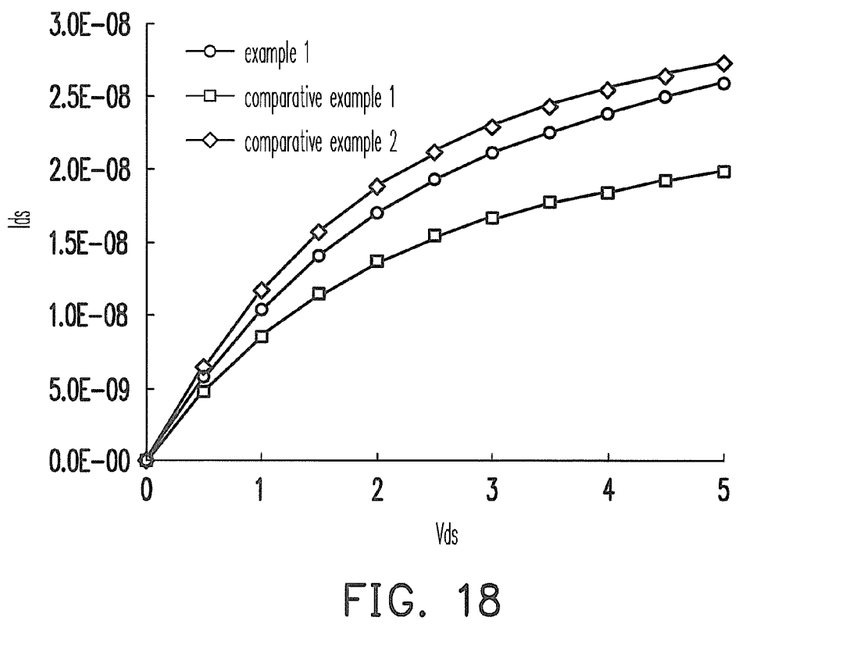
FIG. 18 is an IV-curve diagram showing pixel charging capability.
Figure 19:
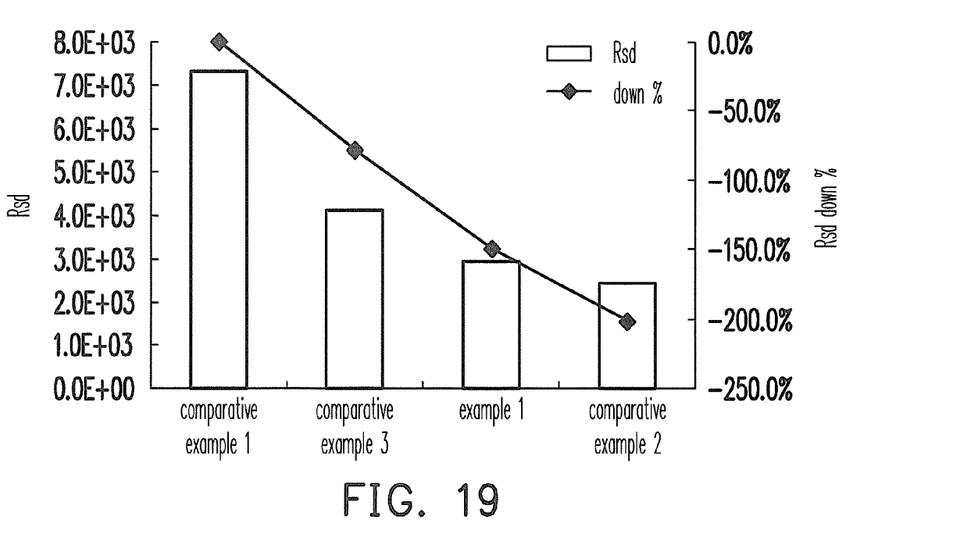
FIG. 19 is a diagram showing a relationship between parasitic resistance and a thickness of the ohmic contact layer of a TFT.

FIG. 18 is an IV-curve diagram showing pixel charging capability. FIG. 19 is a diagram showing a relationship between parasitic resistance and a thickness of the ohmic contact layer of a TFT. In FIG. 18, the TFTs of Example 1 and Comparative Examples 1-2 are used as a switch of a pixel of a liquid crystal display (LCD), and X axis represents the gate-source voltage (Vgs) and Y axis represents drain-source current (Ids). In FIG. 19, the TFTs of Example 1 and Comparative Examples 1-3 are used as a switch of a pixel of a liquid crystal display (LCD), in which the TFT of Comparative Example 3 is a conventional TFT having only one ohmic contact layer of about 400 angstrom as an example, and the left Y axis and the right Y axis respectively represent parasitic resistance and parasitic resistance down ratio. Generally, the parasitic resistance is related to the thickness of the ohmic contact layer as shown in FIG. 19. If the parasitic resistance is lower, the pixel charging capability is better. As FIG. 18 shown, the pixel charging capability of the pixel with the TFT of Example 1 is similar to the Comparative Examples 1-2. In the other word, the semiconductor stacked layer in the TFT of Example 1 does not affect pixel charging capability.

The above-mentioned embodiments can be applied to any kinds of display panel and anywhere about TFT in the any kinds of display panel. The display panel comprising liquid crystal display panel (LCD panel), self-emitting display panel (SED panel), electrophoretic display (EPD panel), other suitable display panel, or any two combinations thereof. The LCD comprise transmissive display panels, trans-reflective display panels, reflective display panels, color filter on array display panels, array on color filter display panels, vertical alignment (VA) display panels, in plane switch (IPS) display panels, multi-domain vertical alignment (MVA) display panels, twist nematic (TN) display panels, super twist nematic (STN) display panels, patterned-silt vertical alignment (PVA) display panels, super patterned-silt vertical alignment (S-PVA) display panels, advance super view (ASV) display panels, fringe field switching (FFS) display panels, continuous pinwheel alignment (CPA) display panels, axially symmetric aligned micro-cell mode (ASM) display panels, optical compensation banded (OCB) display panels, super in plane switching (S-IPS) display panels, advanced super in plane switching (AS-IPS) display panels, ultra-fringe field switching (UFFS) display panels, polymer stabilized alignment display panels, dual-view display panels, triple-view display panels, three-dimensional display panels, blue phase display panels or other types of display panels or combinations thereof. The self-emitting display panel (SED panel) comprise a phosphorescence electro-luminescent display panel, a fluorescence electro-luminescent display panel or combinations thereof, and the self-emitting material can be organic materials, inorganic materials or combinations thereof. Moreover, size of molecules of the aforementioned materials includes small molecules, polymers or combinations thereof.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A thin film transistor (TFT), comprising:
   a gate and a pair of electrodes;
   a first semiconductor layer disposed between the gate and the pair of electrodes;
   a semiconductor stacked layer disposed between the first semiconductor layer and the pair of the electrodes, wherein the semiconductor stacked layer comprises:
      a second semiconductor layer disposed adjacent to the pair of electrodes; and
      at least one pair of semiconductor layers including a third semiconductor layer and a fourth semiconductor layer, the third semiconductor layer being sandwiched between the second semiconductor layer and the fourth semiconductor layer,
   wherein the electric conductivity of the third semiconductor layer is substantially smaller than the electric conductivity of the second semiconductor layer and the electric conductivity of the fourth semiconductor layer, and
   wherein the electric conductivity of the third semiconductor layer is substantially greater than or equal to the electric conductivity of the first semiconductor layer.

2. The TFT of the claim 1, further comprising an additional semiconductor layer disposed between the second semiconductor layer of the semiconductor stacked layer and the pair of electrodes.

3. The TFT of the claim 1, further comprising a buffer layer disposed between the first semiconductor layer and the fourth semiconductor layer of the semiconductor stacked layer, and the electric conductivity of the buffer layer is gradually increased from the first semiconductor layer toward the fourth semiconductor layer of the semiconductor stacked layer.

4. The TFT of claim 1, wherein the pair of electrodes is contacted with the second semiconductor layer.

5. The TFT of claim 1, wherein the gate is disposed below the first semiconductor layer.

6. The TFT of claim 1, wherein the pair of electrodes are disposed below the first semiconductor layer, and the gate is disposed above the first semiconductor layer.

7. The TFT of claim 1, further comprising a dielectric island disposed on the first semiconductor layer and between the first semiconductor layer and the semiconductor stacked layer.

8. A thin film transistor (TFT), comprising:
a gate and a pair of electrodes;
a semiconductor layer disposed on or below the gate, wherein the semiconductor layer comprises:
  at least one first semiconductor region;
  at least one second semiconductor region disposed in at least one side of the first semiconductor region; and
  at least one pair of semiconductor regions including a third semiconductor region and a fourth semiconductor region, the third semiconductor region being sandwiched between the second semiconductor region and the fourth semiconductor region,
  wherein the electric conductivity of the third semiconductor region is substantially smaller than the electric conductivity of the second semiconductor region and the electric conductivity of the fourth semiconductor region, and
  wherein the electric conductivity of the third semiconductor region is substantially greater than or equal to the electric conductivity of the first semiconductor region.

9. The TFT of claim 8, further comprising at least one additional semiconductor region disposed between the second semiconductor region and the pair of electrodes.

10. The TFT of the claim 8, further comprising at least one buffer region disposed between the first semiconductor region and the fourth semiconductor region, and the electric conductivity of the buffer region is gradually increased from the first semiconductor region toward the fourth semiconductor region.

11. The TFT of claim 8, wherein the pair of electrodes is contacted with the second semiconductor region.

* * * * *